(12) United States Patent
Hsue et al.

(10) Patent No.: US 6,221,710 B1
(45) Date of Patent: Apr. 24, 2001

(54) METHOD OF FABRICATING CAPACITOR

(75) Inventors: C. C. Hsue, Hsinchu; Wei-Chung Chen, Tainan, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/222,621

(22) Filed: Dec. 29, 1998

(51) Int. Cl.$^7$ ................................................. H01L 21/8234

(52) U.S. Cl. ........................ 438/238; 438/240; 438/253; 438/254; 438/396

(58) Field of Search .................................... 438/232, 396, 438/254, 240, 253

(56) References Cited

U.S. PATENT DOCUMENTS

| | | | |
|---|---|---|---|
| 5,330,931 | * 7/1994 | Emesh et al. | 437/60 |
| 5,516,719 | * 5/1996 | Ryou | 437/60 |
| 5,834,357 | * 11/1998 | Kang | 438/396 |
| 6,057,189 | * 5/2000 | Huang et al. | 438/253 |

* cited by examiner

*Primary Examiner*—Vu A. Le
*Assistant Examiner*—Pho Luu
(74) *Attorney, Agent, or Firm*—Thomas, Kayden, Horstemeyer & Risley

(57) ABSTRACT

A method of fabricating a capacitor on a semiconductor substrate. A barrier layer is formed over the substrate to serve as a bottom electrode of the capacitor. A dielectric layer is formed on the barrier layer. An upper electrode is formed on the dielectric layer. In addition, the method can be used in a dynamic random access memory.

10 Claims, 3 Drawing Sheets

METHOD OF FABRICATING CAPACITOR

BACKGROUND OF THE INVENTION

1. Field of Invention

The present invention relates to a semiconductor device fabrication. More particularly, the present invention relates to a method of fabricating a capacitor.

2. Description of Related Art

Polysilicon is commonly used as an electrode for a capacitor in a semiconductor device fabrication. However, an electrode made from polysilicon still has many disadvantages such as depletion occurring in the polysilicon electrode. The depletion causes instability of the capacitor's capacitance so as to decrease the performance of devices.

FIG. 1 is a schematic, cross-sectional view showing a conventional method of fabricating a capacitor. As shown in FIG. 1, a semiconductor substrate 101 is provided. A polysilicon layer 107 is formed over the substrate 101. The polysilicon layer 107 is a part of a structure preformed over the substrate 101. A dielectric layer 105 is formed over the substrate 110. A tungsten plug 103 is formed in the dielectric layer 105. A barrier/glue layer 108 is formed between the tungsten plug 103 and the dielectric layer 105 to increase adhesion between the metal plug 103 and the dielectric layer 105.

Another barrier/glue layer 109 is formed over the substrate 101 to cover the metal plug 103. A polysilicon layer 111 is formed on the barrier/glue 109 to serve as a bottom electrode of a capacitor formed subsequently. A dielectric layer 113 made EXPRESS MAL NO. from oxide is formed on the polysilicon layer 115. Another polysilicon layer 115 is formed on the dielectric layer 113 to serve as an upper electrode. A complete capacitor is formed.

In the conventional method, some ions such as phosphorous ions or arsenic ions are doped into the polysilicon layer which serves as the bottom electrode of the capacitor in order to increase conductivity. However, when a voltage is applied to the upper electrode of the capacitor, inductive charges are generated. Thus, the inductive charges generated at the interfacial between the bottom electrode and the dielectric layer are neutralized with the dopants of the polysilicon layer so as to form a depletion region in the bottom electrode.

As shown in FIG. 2, FIG. 2 is a schematic, cross-sectional view of what happens when a voltage is applied to a conventional capacitor. A capacitor 120 is composed of polysilicon layers 117, 119 and a dielectric layer 121. When a negative voltage is applied to an upper electrode 117 of the capacitor 120, inductive positive charges are generated in a bottom electrode 119 of the capacitor 120. At this time, a part of the inductive positive charges is neutralized with the dopants of the polysilicon layer so as to form a depletion region 123 at the interface between the bottom electrode 119 and the dielectric layer 121.

The depletion region 123 is viewed as a dielectric layer. In other words, the dielectric layer 121 is thickened due to the depletion region 123. The thickness of the dielectric layer 121 is increased. Since the charge-storing ability of the capacitor is relative to the thickness of the dielectric layer, the thinner the dielectric layer is, the greater the capacitance of the capacitor. The depletion region causes an increase in the thickness of the dielectric layer, in other words, the capacitor's capacitance is lowered so as to reduce performance of devices. Moreover, as different voltages are applied to the capacitor, the thickness of the depletion region 108 is changed. The voltage coefficient (1/C(dC/dV)) of the capacitor is thus increased so that the capacitance of the capacitor is changed as the different voltages are applied. Thus, stability of devices is decreased.

SUMMARY OF THE INVENTION

Accordingly, the present invention provides a method of fabricating a capacitor. The method not only simplifies the process but also avoids a depletion region generated in a polysilicon electrode as seen in a conventional method, which causes a decrease in a capacitor's capacitance. Thus, performance of devices is increased.

To achieve these and other advantages and in accordance with the purpose of the invention, as embodied and broadly described herein, the invention provides a method of fabricating a capacitor. A semiconductor substrate is provided. A barrier layer is formed over the substrate to serve as a bottom electrode of the capacitor. A dielectric layer is formed on the barrier layer. An upper electrode is formed on the dielectric layer. In addition, the method can be used in a dynamic random access memory.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
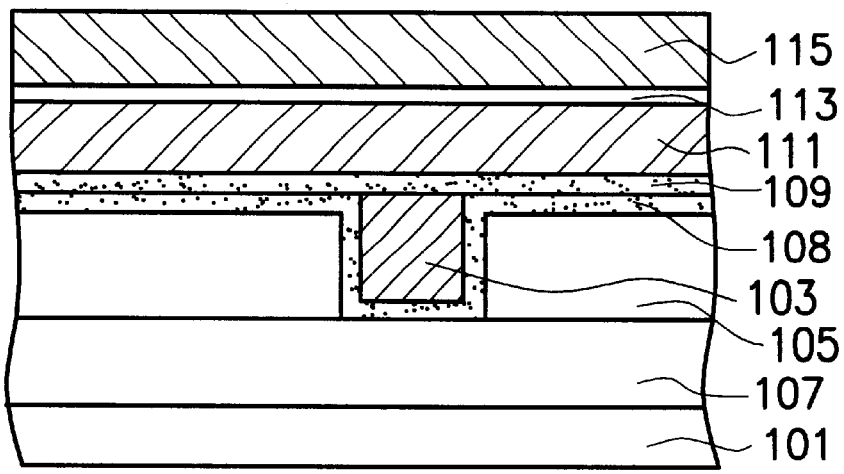
FIG. 1 is a schematic, cross-sectional view showing a conventional method of fabricating a capacitor.
Figure 2:
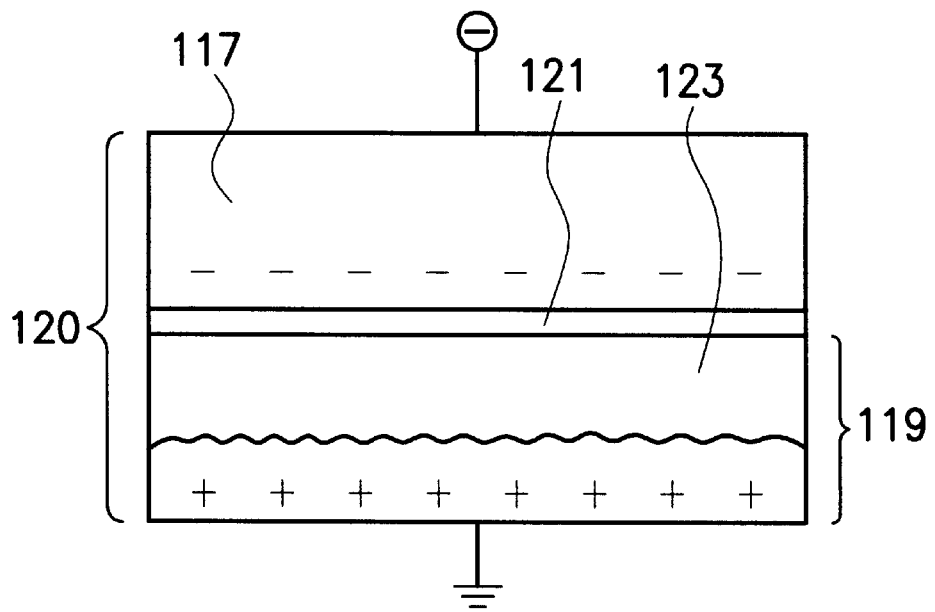
FIG. 2 is a schematic, cross-sectional view of what happens when a voltage is applied to a conventional capacitor.

Reference will now be made in detail to the present preferred embodiments of the invention, examples of which are illustrated in the accompanying drawings. Wherever possible, the same reference numbers are used in the drawings and the description to refer to the same or like parts.

Figure 3A:
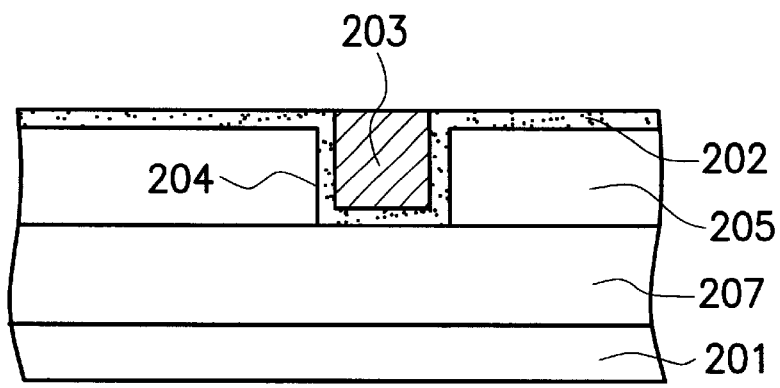
FIGS. 3A through 3C are schematic, cross-sectional views showing a method of fabricating a capacitor according to one preferred embodiment of this invention.
Figure 3B:
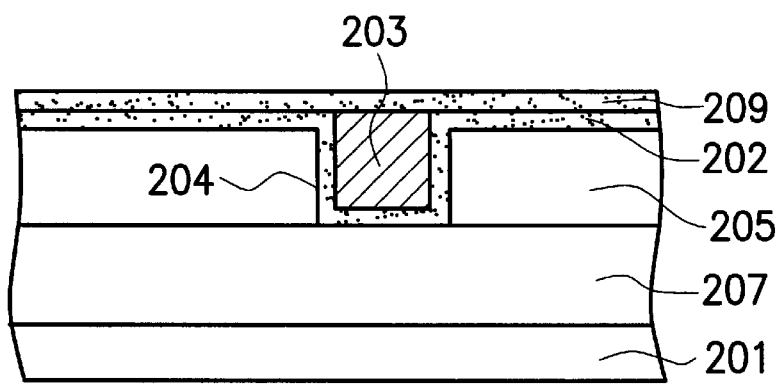
Figure 3C:
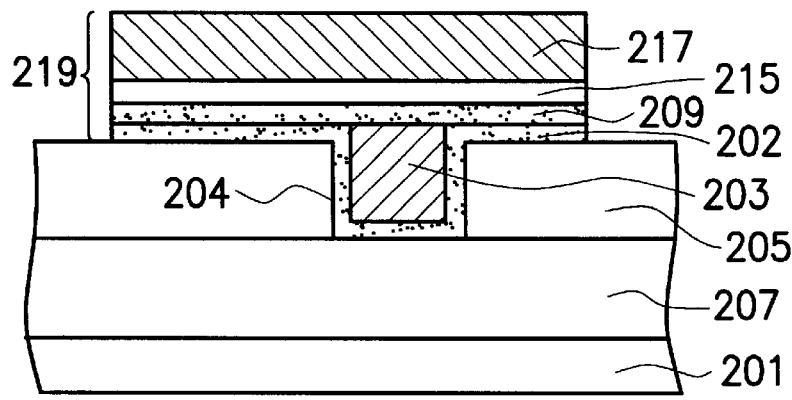

FIGS. 3A through 3C are schematic, cross-sectional views showing a method of fabricating a capacitor according to one preferred embodiment of this invention.

As shown in FIG. 3A, a semiconductor substrate 201 is provided. A conductive layer 207 is formed over the substrate 201. The conductive layer 207 is a part of a structure preformed over the substrate 201. A dielectric layer 205 is formed over the substrate 201, for example by chemical vapor deposition (CVD). The dielectric layer 205 includes, for example, silicon dioxide. The dielectric layer 205 is defined to form an opening 204 so that the conductive layer 207 is exposed by the opening 204.

A barrier layer 202 is formed on the substrate 207 and on the opening 204. The barrier layer 202 includes, for example, titanium/titanium nitride (Ti/TiN). The methods of forming the barrier layer 202 include forming a titanium layer over the dielectric layer 205 and on the opening 204 by sputtering deposition, for example. A nitridation is performed to form a titanium nitride layer on the titanium layer. A plug 203 is formed in the dielectric layer 205, for example, by CVD. The plug 203 includes, for example, tungsten.

As shown in FIG. 3B, another barrier layer 209 is formed over the substrate 201 to cover the plug 203. The barrier layer 209 includes, for example, titanium/titanium nitride. The methods of forming the barrier layer 209 include forming a titanium layer over the substrate 201 by sputtering deposition, for example. A nitridation is performed to form a titanium nitride layer on the titanium layer. Another method is to form a titanium layer by sputtering deposition. A titanium nitride layer is formed on the titanium layer by reactive sputtering deposition. The barrier layer 209 is used as a bottom electrode of a capacitor formed subsequently, which is the feature of the invention.

In the conventional method, the next step is to form a polysilicon layer to serve as a bottom electrode of a capacitor. In the invention, the barrier layer 209 is formed to serve as the bottom electrode. Therefore, the polysilicon layer is not necessarily formed in the invention so that the capacitor fabrication is thus simplified.

As shown in FIG. 3C, a dielectric layer 215 is formed on the barrier layer 209, for example, by CVD. The dielectric layer 215 includes, for example, tantalum oxide $Ta_2O_5$). A metallic layer 217 is formed on the dielectric layer 215, for example, by puttering deposition in order to serve as an upper electrode of a capacitor formed subsequently. The metallic layer 217 includes, for example, aluminum or aluminum-bronze alloy. The metallic layer 217, the dielectric layer 215 and the barrier layer 209, 202 are defined to form a capacitor 219. The capacitor 219 is composed of the barrier layer 209 (the bottom electrode), the metallic layer 217 (the upper electrode), and the dielectric layer 215.

The barrier layer 209 is used as a bottom electrode of a capacitor, which is the feature of the invention. In the conventional method, a polysilicon layer is formed to serve as an electrode of a capacitor. A metal plug is formed to electrically couple a conductive layer and the polysilicon layer. But the adhesion between the polysilicon layer and the metal plug is poor, so a barrier layer made from titanium/titanium nitride is formed between the polysilicon layer and the metal plug to increase the adhesion. In the invention, the barrier layer is formed to serve as the bottom electrode of the capacitor. Therefore, the polysilicon layer is not necessarily formed in the invention so that the capacitor fabrication is thus simplified.

The titanium/titanium nitride layer is formed to serve as the bottom electrode of the capacitor. When a voltage is applied to the capacitor in the invention, a depletion region does not occur in the bottom electrode, which depletion region is easily generated in the bottom electrode made from polysilicon in the conventional method. Therefore the thickness of the dielectric layer is not affected when the voltage is applied, so that performance of the capacitor is increased. Additionally, the thickness of the dielectric layer is not changed with the voltage, so capacitance of the capacitor is not changed by much, with the result that stability of devices is increased.

The metallic layer is formed to serve as the upper electrode. The conductivity of the metal is better than polysilicon used in the conventional method. Therefore performance of devices is thus increased. Moreover, no additional steps are added to the whole processes. The capacitor is fabricated using standard semiconductor equipment and processes, and hence the invention can be quite easily incorporated into a conventional semiconductor production line.

Figure 4:
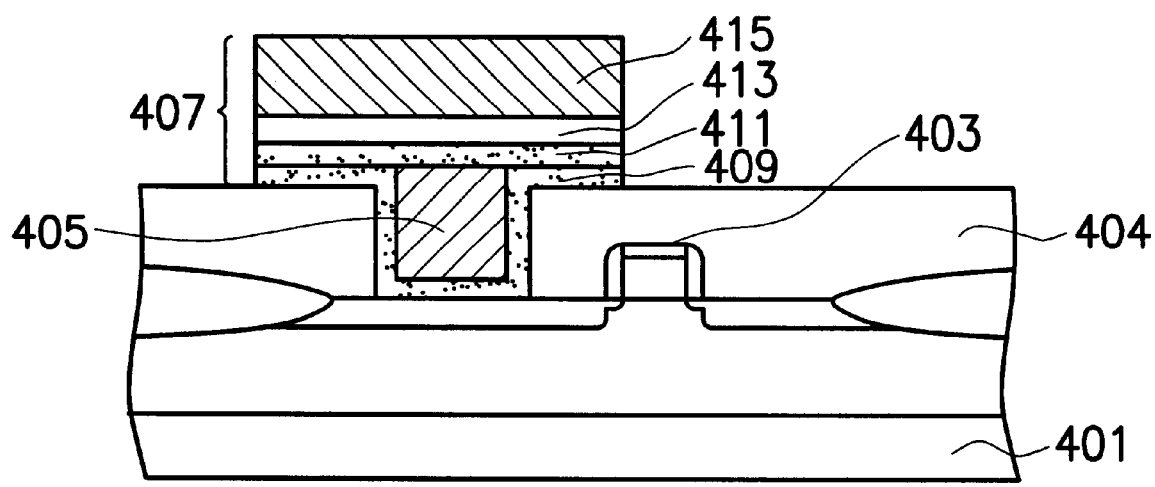
FIG. 4 is a schematic, cross-sectional view showing a method of fabricating a capacitor in a dynamic random access memory according to one preferred embodiment of this invention.

In addition, the invention can be used in a dynamic random access memory (DRAM) fabrication. FIG. 4 is a schematic, cross-sectional view showing a method of fabricating a capacitor in dynamic random access memory according to one preferred embodiment of this invention. As shown in FIG. 4, a semiconductor substrate 401 is provided wherein a transistor 403 is formed thereon. A dielectric layer 404 having a metal plug 405 is formed over the substrate 401. A barrier layer 409 is formed between the metal plug 405 and the dielectric layer 404. A barrier layer 411, a dielectric layer 413, and a metallic layer 415 are subsequently formed over the substrate 401. The barrier layer 409 is formed to serve as a bottom electrode. A capacitor 407 is thus formed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor in a semiconductor substrate, comprising:

forming a barrier layer over the substrate to serve as a bottom electrode of the capacitor;

forming a dielectric layer directly on the barrier layer; and forming an upper electrode on the dielectric layer.

2. The method according to claim 1, wherein the barrier layer comprises titanium/titanium nitride.

3. The method according to claim 1, wherein the step of forming the barrier layer comprises:

forming a titanium layer over the substrate; and forming a titanium nitride layer on the titanium layer.

4. The method according to claim 1, wherein the upper electrode comprises aluminum.

5. The method according to claim 1, wherein the upper electrode comprises aluminum-bronze alloy.

6. A method of fabricating a capacitor in a dynamic random access memory, wherein a transistor is formed on a semiconductor substrate, and a plug is formed thereon, comprising:

forming a barrier layer over the substrate to cover the plug and to serve as a bottom electrode of the capacitor;

forming a dielectric layer directly on the barrier layer; and forming an upper electrode on the dielectric layer.

7. The method according to claim 6, wherein the barrier layer comprises titanium/titanium nitride.

8. The method according to claim 6, wherein the step of forming the barrier layer comprises:

forming a titanium layer over the substrate; and forming a titanium nitride layer on the titanium layer.

9. The method according to claim 6, wherein the upper electrode comprises aluminum.

10. The method according to claim 6, wherein the upper electrode comprises aluminum-bronze alloy.

* * * * *